(12) United States Patent
Mori et al.

(10) Patent No.: US 10,964,716 B2
(45) Date of Patent: Mar. 30, 2021

(54) SEMICONDUCTOR DEVICE AND METHOD OF MANUFACTURING SAME

(71) Applicant: Toshiba Memory Corporation, Tokyo (JP)

(72) Inventors: Shinji Mori, Nagoya Aichi (JP); Kazuhiro Matsuo, Kuwana Mie (JP); Yuta Saito, Yokkaichi Mie (JP); Keiichi Sawa, Yokkaichi Mie (JP); Kazuhisa Matsuda, Yokkaichi Mie (JP); Atsushi Takahashi, Yokkaichi Mie (JP); Masayuki Tanaka, Yokkaichi Mie (JP); Kenichiro Toratani, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/275,509

(22) Filed: Feb. 14, 2019

(65) Prior Publication Data

US 2020/0091172 A1   Mar. 19, 2020

(30) Foreign Application Priority Data

Sep. 13, 2018  (JP) .............................. JP2018-171369

(51) Int. Cl.
| | |
|---|---|
| *H01L 27/11582* | (2017.01) |
| *H01L 21/28* | (2006.01) |
| *H01L 21/3065* | (2006.01) |
| *H01L 21/311* | (2006.01) |
| *H01L 29/423* | (2006.01) |

(52) U.S. Cl.
CPC .... *H01L 27/11582* (2013.01); *H01L 21/3065* (2013.01); *H01L 21/31116* (2013.01); *H01L 29/40117* (2019.08); *H01L 29/4234* (2013.01)

(58) Field of Classification Search
None
See application file for complete search history.

(56) References Cited

U.S. PATENT DOCUMENTS

| | | | |
|---|---|---|---|
| 8,415,242 B2 * | 4/2013 | Mizushima | ......... H01L 29/7926 438/591 |
| 2013/0178030 A1 | 7/2013 | Ramkumar et al. | |

(Continued)

FOREIGN PATENT DOCUMENTS

| | | |
|---|---|---|
| JP | 2011023543 A | 2/2011 |
| JP | 2015053336 A | 3/2015 |

*Primary Examiner* — Robert K Carpenter
(74) *Attorney, Agent, or Firm* — Kim & Stewart LLP

(57) ABSTRACT

A semiconductor device comprises a substrate. A plurality of electrode layers and a plurality of insulating layers are formed in an alternating stack above the substrate. A semiconductor column extends through the plurality of electrode layers and the plurality of insulating layers. The semiconductor column comprises a single-crystal semiconductor material on an outer peripheral surface facing the electrode and insulating layers. First insulating films are formed between the semiconductor column and the electrode layers. The first insulating films are spaced from each other along the column length. Each first insulating film corresponds to one electrode layer. A charge storage layer is between each of the first insulating films and the electrode layers. A second insulating film is between the charge storage layer and each of the electrode layers.

20 Claims, 6 Drawing Sheets

(56) References Cited

U.S. PATENT DOCUMENTS

2015/0060998 A1 3/2015 Mizushima
2015/0111352 A1* 4/2015 Lee ................... H01L 29/40117
  438/268
2017/0330623 A1* 11/2017 Kim .................... H01L 29/7391

* cited by examiner

SEMICONDUCTOR DEVICE AND METHOD OF MANUFACTURING SAME

CROSS-REFERENCE TO RELATED APPLICATION

This application is based upon and claims the benefit of priority from Japanese Patent Application No. 2018-171369, filed Sep. 13, 2018, the entire contents of which are incorporated herein by reference.

FIELD

Embodiments described herein relate generally to a semiconductor device and a method of manufacturing the same.

BACKGROUND

Variations in dimensions of various components in three-dimensional memory devices or the like resulting from variations in manufacturing processes may ultimately diminish the reliability and performance of the memory devices. For example, a variation in a diameter of a memory hole in a three-dimensional memory device causes a variation in a thickness of a channel semiconductor layer, possibly resulting in variations in a cell current and a threshold voltage for individual memory cells in the device.

DESCRIPTION OF THE DRAWINGS

FIGS. 2A and 2B through FIGS. 6A and 6B are cross-sectional views depicting aspects of a method of manufacturing the semiconductor device according to the first embodiment.

DETAILED DESCRIPTION

Figure 1:
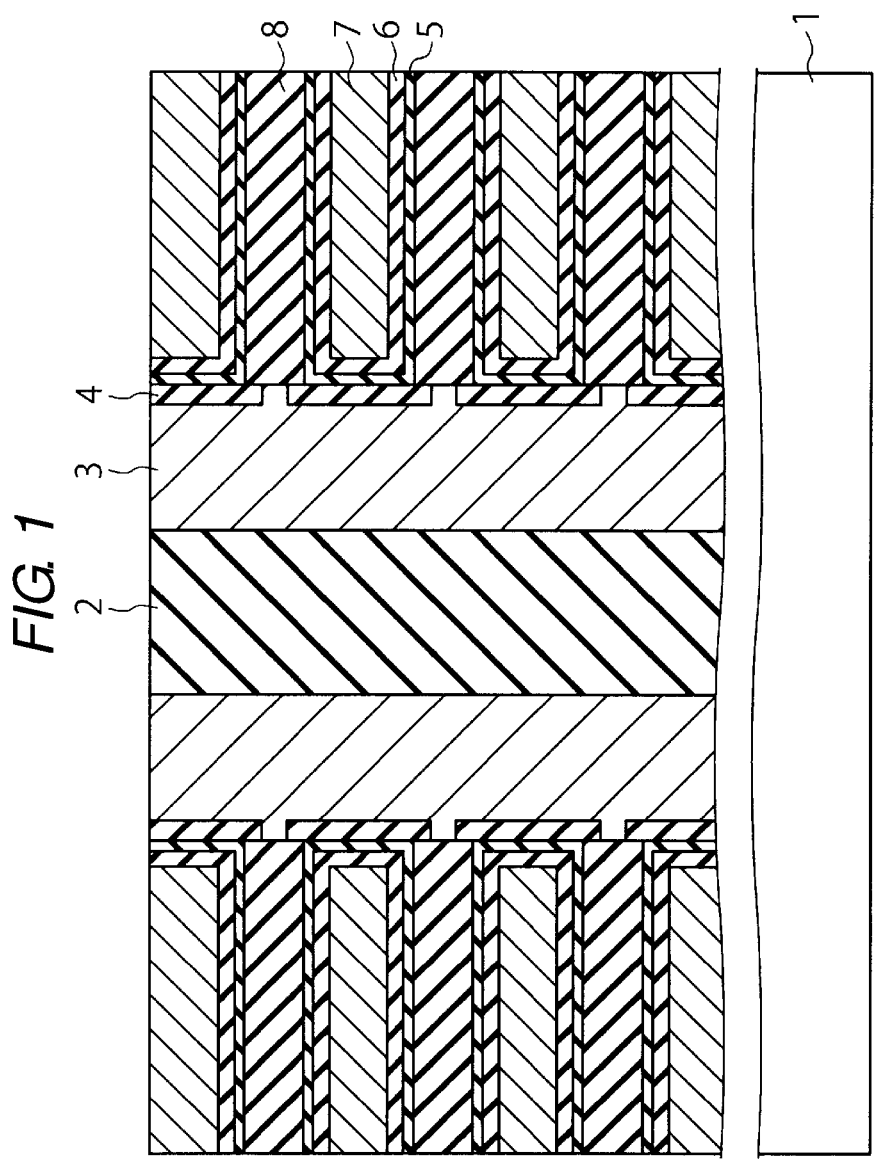
FIG. 1 is a cross-sectional view showing a structure of a semiconductor device according to a first embodiment.

In general, according to one embodiment, a semiconductor device comprises a substrate. A plurality of electrode layers and a plurality of insulating layers are formed in an alternating stack above a surface of the substrate. A semiconductor column extends in a first direction orthogonal to the surface of the substrate through the plurality of electrode layers and the plurality of insulating layers. The semiconductor column comprises a single-crystal semiconductor material on an outer periphery (surface facing the stack of insulating and electrode layers). A plurality of first insulating films are formed between the semiconductor column and the electrode layers. The first insulating films are spaced from each other in the first direction along the column length. Each first insulating film corresponds to one respective electrode layer. A charge storage layer is between each of the first insulating films and each of the electrode layers in a second direction parallel to the surface of the substrate. A second insulating film is between the charge storage layer and each of the electrode layers.

Embodiments of the present disclosure will be described hereinafter with reference to the drawings. In the figures, the same or similar constituent elements are denoted by the same reference numerals and repetitive description may be omitted.

First Embodiment

FIG. 1 is a cross-sectional view showing a structure of a semiconductor device according to a first embodiment. The semiconductor device of FIG. 1 is, for example, a three-dimensional memory.

The semiconductor device of FIG. 1 includes a substrate 1, a core insulating film 2, a channel semiconductor layer 3, a plurality of tunnel insulating films 4, a plurality of charge storage layers 5, a plurality of block insulating films 6, a plurality of electrode layers 7, and a plurality of insulating layers 8.

The substrate 1 is, for example, a semiconductor substrate such as an silicon (Si) substrate. FIG. 1 depicts an X direction and a Y direction parallel to a surface of the substrate 1 and perpendicular to each other, and a Z direction perpendicular to the surface of the substrate 1. In the present specification, a +Z direction is regarded as the upward direction and a −Z direction is regarded as the downward direction. The −Z direction may either match the direction of gravity or not match the direction of gravity.

The core insulating film 2, the channel semiconductor layer 3, the tunnel insulating films 4, the charge storage layers 5, the block insulating films 6, the electrode layers 7, and the insulating layers 8 are each either directly formed on the substrate 1 or are on the substrate 1 via at least one other intervening layer (for example, an interlayer insulating film or a source layer). In the latter case, at least one of an electrode layer 7 or an insulating layer 8 comes in contact with the substrate 1 or connects to the substrate 1 via another semiconductor layer. The core insulating film 2, the channel semiconductor layer 3, the tunnel insulating films 4, the charge storage layers 5, the block insulating films 6, the electrode layers 7, and the insulating layers 8 form a plurality of memory cells. The channel semiconductor layer 3 functions as a channel of these memory cells. The electrode layers 7 function as word lines of these memory cells.

In the present embodiment, a plurality of first films (each including one charge storage layer 5, one block insulating film 6, and one electrode layer 7) and a plurality of second films (each including one insulating layer 8) are alternately stacked on the substrate 1. The core insulating film 2, the channel semiconductor layer 3, and the tunnel insulating films 4 are formed in the first and second films in such a manner as to be surrounded by the first and second films. The core insulating film 2, the channel semiconductor layer 3, and the tunnel insulating films 4 are formed in a memory hole that is formed in the first and second film.

In the present embodiment, the core insulating film 2 has a columnar shape extending in the Z direction. The core insulating film 2 has a cylindrical shape. The channel semiconductor layer 3 has a tubular shape extending in the Z direction and surrounds the core insulating film 2. The channel semiconductor layer 3 has a circular tube shape. The core insulating film 2 is, for example, a silicon oxide ($SiO_2$) film. The channel semiconductor layer 3 is, for example, a single-crystal semiconductor layer such as a single-crystal silicon layer. In this instance, the channel semiconductor layer 3 comprises silicon and may also contain B (boron), P (phosphorus), As (arsenic), C (carbon), or Ge (germanium) as a compound element with or an impurity element within silicon. The channel semiconductor layer 3 has the same crystal plane orientation as the substrate 1 in the present embodiment.

A tunnel insulating film 4, a charge storage layer 5, and a block insulating film 6 are sequentially formed between the channel semiconductor layer 3 and the corresponding electrode layer 7. It is noted, however, that the tunnel insulating films 4 in the present embodiment are each formed outside of the region between the insulating layers 8, while the charge storage layers 5 and the block insulating films 6 in the present embodiment are each formed inside a region between the insulating layers 8. That is, the tunnel insulating films 4 are not sandwiched between the insulating layers 8 and the charge storage layers 5, but the block insulating films 6 are sandwiched between the insulating layers 8.

The tunnel insulating films 4 are in the channel semiconductor layer 3 and divided to correspond to the electrode layers 7. Thus, one tunnel insulating film 4 is formed between the channel semiconductor layer 3 and an electrode layer 7. Examples of the advantage in dividing the tunnel insulating films 4 to correspond to the electrode layers 7 include an increase in cell current caused by enhancing an electric field applied to the tunnel insulating films 4 from the electrode layers 7 and increasing the number of inversion carriers. The tunnel insulating films 4 in the present embodiment each have a tubular shape surrounding the channel semiconductor layer 3. As shown in FIG. 1, a tunnel insulating film 4 may contact a side surface of each charge storage layer 5 as well a portion of a side surface of each of the insulating layers 8 adjacent to the charge storage layer 5. In other examples, a tunnel insulating film 4 may only contact a side surface of each charge storage layer 5. The tunnel insulating films 4 are, for example, $SiO_2$ films or silicon oxynitride (SiON) films.

A charge storage layer 5 and a block insulating film 6 are sequentially formed on a side surface of each tunnel insulating film 4 and on upper and lower surfaces of the insulating layers 8. Thus, each charge storage layer 5 and each block insulating film 6 have a U-shaped cross-sectional shape in FIG. 1. The charge storage layers 5 are, for example, silicon nitride (SiN) films or metal oxide films. The block insulating films 6 are, for example, $SiO_2$ films.

The electrode layers 7 and the insulating layers 8 are alternately formed on the substrate 1. One charge storage layer 5 and one block insulating film 6 are interposed between each electrode layer 7 and each insulating layer 8. The electrode layers 7 are, for example, metal layers such as tungsten (W) layers. The insulating layers 8 are, for example, $SiO_2$ films.

The channel semiconductor layer 3 in the present embodiment is not a polycrystalline semiconductor layer such as a polycrystalline Si layer but is rather a single-crystal semiconductor layer such as a single-crystal Si layer. This can increase a cell current of each memory cell. An example of a method of forming the single-crystal semiconductor layer as the channel semiconductor layer 3 will be described below.

Furthermore, the channel semiconductor layer 3 in the present embodiment is not a full columnar shape but rather a tubular shape or a hollow cylinder shape with an interior region filled with core insulating film 2. Generally, a diameter of a memory hole is difficult to control, but a thickness of the channel semiconductor layer 3 is easy to control. According to the present embodiment, forming the channel semiconductor layer 3 in a tubular shape enables the channel semiconductor layer 3 to be manufactured in a shape having a relatively easily manufacturable specification (the layer thickness). Precisely controlling the thickness of the channel semiconductor layer 3 makes it possible to prevent variations in the cell current and in the threshold voltage of the memory cell.

Moreover, a charge storage layer 5 and a block insulating film 6 in the present embodiment are formed inside a region between insulating layers 8 and thus these layers are formed only outside of the memory hole. It is thereby possible to prevent the memory hole from being narrowed by inclusion of charge storage layers 5 and the block insulating films 6. It is thus easier to manufacture the channel semiconductor layer 3 into the tubular shape because a larger space for forming the channel semiconductor layer 3 is left in the memory hole.

Furthermore, the tunnel insulating films 4 in the present embodiment are divided and the individual tunnel insulating films 4 are positioned to correspond primarily to the electrode layers 7. This can enhance the electric field applied from the electrode layers 7 to the tunnel insulating films 4 and increase the cell current of each memory cell. According to the present embodiment, one tunnel insulating film 4, one charge storage layer 5, and one block insulating film 6 can be formed for each electrode layer 7.

FIGS. 2A, 2B to 6A, 6B are cross-sectional views showing a method of manufacturing the semiconductor device according to the first embodiment.

Figure 2A:
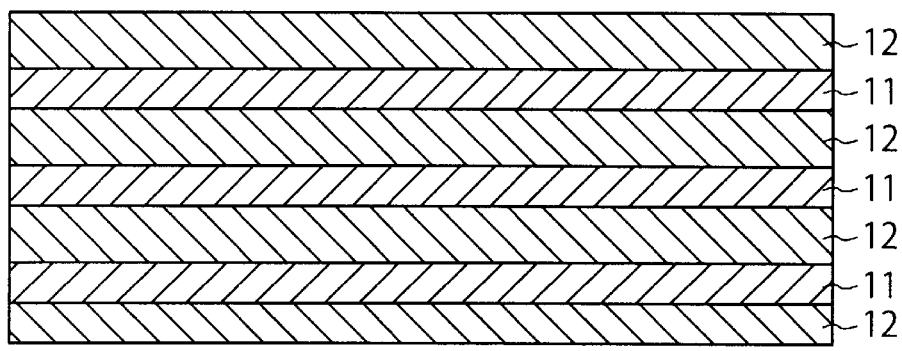

First, a plurality of first semiconductor layers 11 and a plurality of second semiconductor layers 12 are alternately formed on the substrate 1 (FIG. 2A). The first semiconductor layers 11 are, for example, silicon-germanium (SiGe) layers containing Si atoms and Ge atoms at a ratio of 1-X to X in the number of atoms (where X is a real number satisfying 0<X<1). The second semiconductor layers 12 are, for example, SiGe layers containing Si atoms and Ge atoms at a ratio of 1-Y to Y in the number of atoms (where Y is a real number satisfying 0<Y<X). A value of X is, for example, 0.50 (50%). A value of Y is, for example, 0.20 (20%). For example, the first and second semiconductor layers 11 and 12 are formed by epitaxial growth and each have a thickness of 25 nm.

Figure 2B:
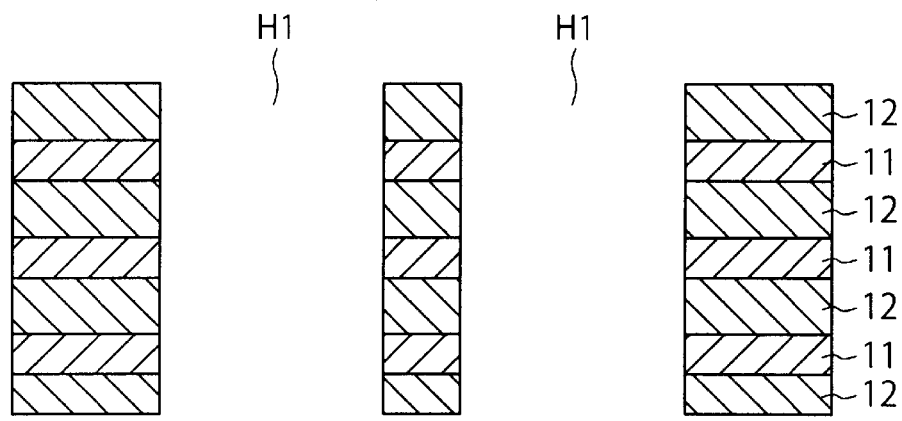

Next, as depicted in FIG. 2B, memory holes H1 penetrating the first semiconductor layers 11 and the second semiconductor layers 12 are formed by reactive ion etching (RIE). The memory holes H1 are an example of recess portions.

Figure 3A:
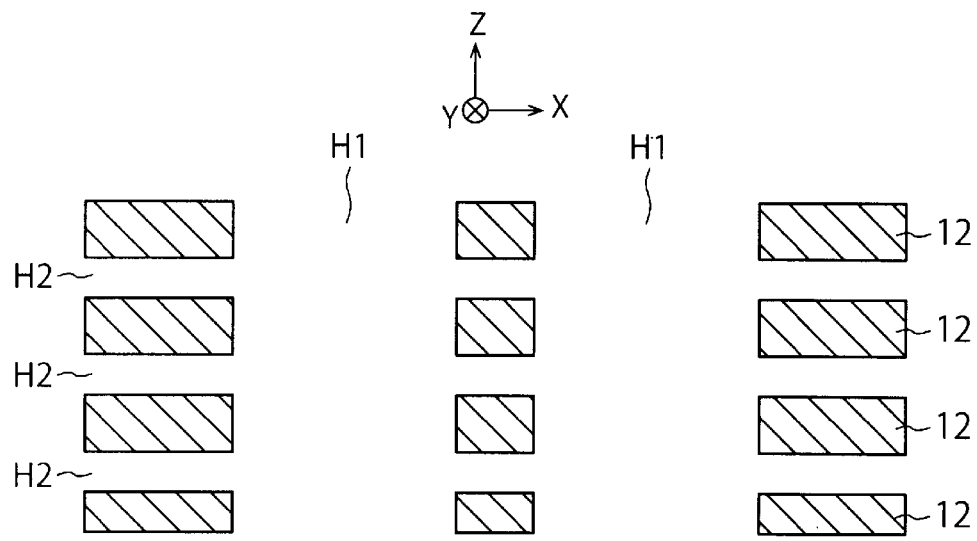

Next, the first semiconductor layers 11 are selectively removed by etching via the memory holes H1 (FIG. 3A). As a result, a plurality of cavities (air gaps) H2 are formed between the second semiconductor layers 12. This etching may be wet etching using an alkaline chemical solution or dry etching using a halogen gas. Examples of the chemical solution for the wet etching include a nitrohydrofluoric solution and a trimethyl(2-hydroxyethyl) ammonium hydroxide(TMY) solution. In the present embodiment, this etching process is conducted at 550° C. using an hydrogen chloride (HCL) gas and hydrogen($H_2$) gas. The first semiconductor layers 11 can be selectively removed according to this process.

Figure 3B:
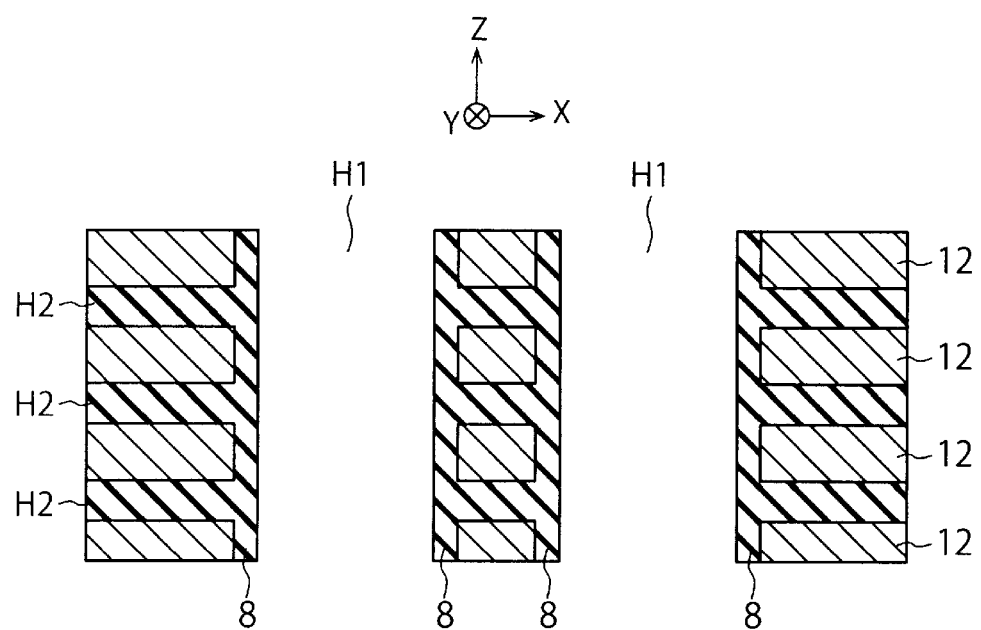

Next, the insulating layers 8 are formed on surfaces of the second semiconductor layers 12 by atomic layer deposition (ALD) (FIG. 3B). The insulating layers 8 are formed in the air gaps H2 between upper and lower surfaces of the second semiconductor layers 12 and on side surfaces of the second semiconductor layers 12.

Figure 4A:
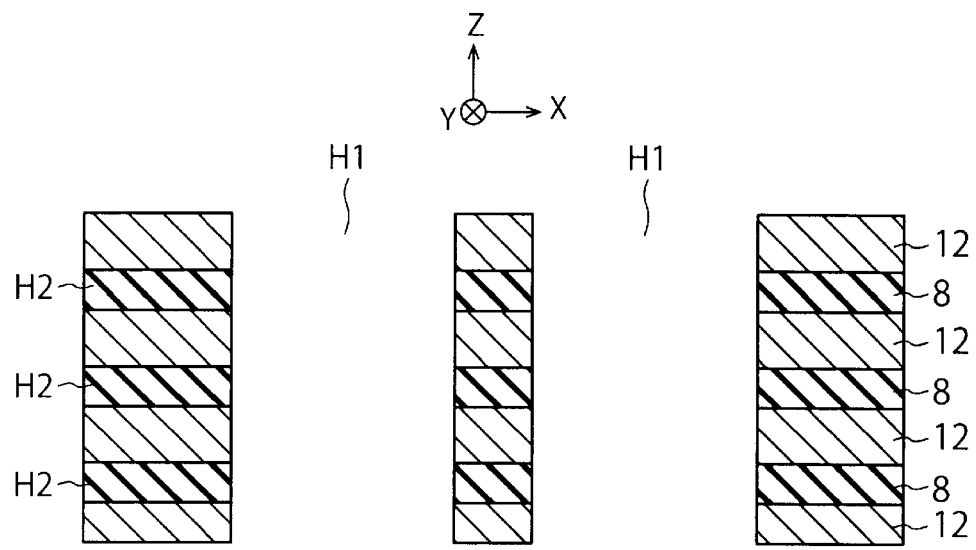

Next, the insulating layers 8 are removed from the side surfaces of the second semiconductor layers 12 by RIE (FIG. 4A). As a result, the insulating layers 8 are now divided so as to correspond to the air gaps H2. A stacked film alternately including the second semiconductor layers 12 and insulating layers 8 has been formed on the substrate 1.

Figure 4B:
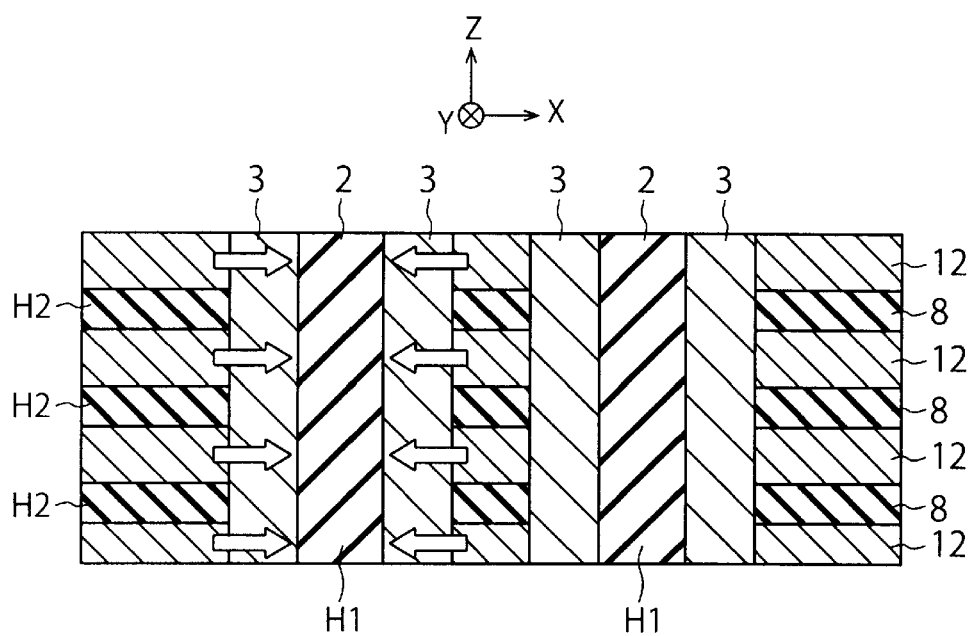

Next, the channel semiconductor layer 3 is grown (see arrows in FIG. 4B) in each memory hole H1 by epitaxial growth on the side surface of the memory hole H1 (FIG. 4B). Specifically, a single-crystal Si layer is grown on side surfaces of the SiGe layers in each memory hole H1. As a result, the channel semiconductor layer 3 having the tubular shape extending in the Z direction is formed on the surfaces of the second semiconductor layers 12 and the insulating layers 8. A thickness of the channel semiconductor layer 3 is, for example, 30 to 50 nm. The channel semiconductor layer 3 is an example of a third semiconductor layer. Next, the core insulating film 2 is filled into each memory hole H1, more particularly the portion of each memory hole H1 left unfilled by the formation of the channel semiconductor layer 3 (FIG. 4B).

It is noted that the first semiconductor layers 11 and the second semiconductor layers 12 in the present embodiment are alternately grown from the substrate 1 by epitaxial growth. Specifically, a first semiconductor layer 11 is grown on the substrate 1, then a second semiconductor layer 12 is grown on the first semiconductor layers 11, then a first semiconductor layer 11 is grown on the second semiconductor layer 12, etc. These processes are repeated to form the stack of first semiconductor layers 11 and second semiconductor layers 12. Thus, the first semiconductor layers 11 and the second semiconductor layers 12 in the present embodiment have the same crystal plane orientation as the substrate 1. Furthermore, the channel semiconductor layer 3 in the present embodiment is grown on the side surfaces of the second semiconductor layers 12 by epitaxial growth as described above. Thus, the channel semiconductor layer 3 in the present embodiment also has the same crystal plane orientation as the substrate 1, which is the same as the first semiconductor layers 11 and the second semiconductor layers 12.

Figure 5A:
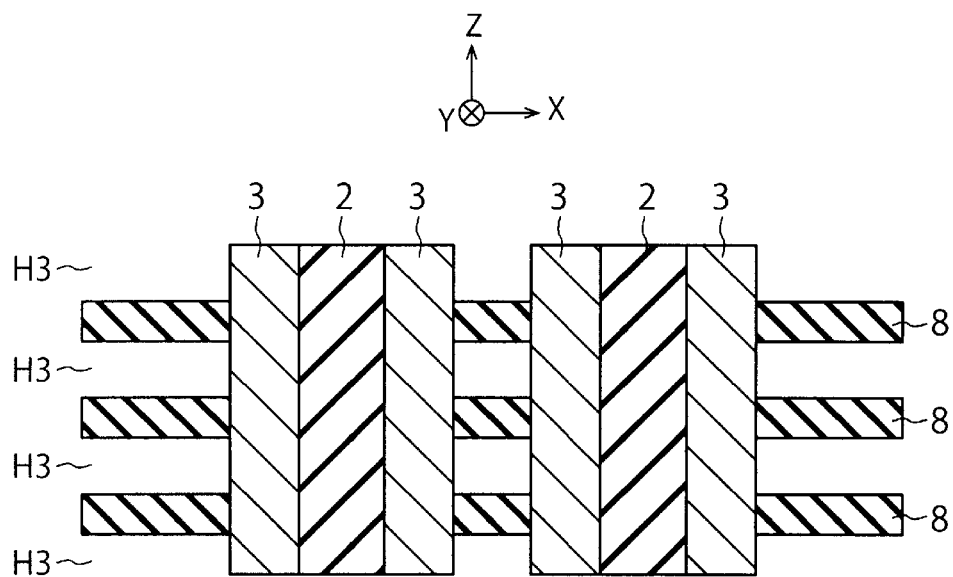

Next, slits, which are not depicted, are formed in such a manner as to penetrate the plurality of second semiconductor layers 12 and the plurality of insulating layers 8, and the second semiconductor layers 12 are selectively removed by wet etching via the slits (FIG. 5A). As a result, a plurality of air gaps H3 are formed between the insulating layers 8. Examples of the chemical solution for the wet etching include a nitrohydrofluoric solution and a trimethyl(2-hydroxyethyl)ammonium hydroxide(TMY) solution.

Figure 5B:
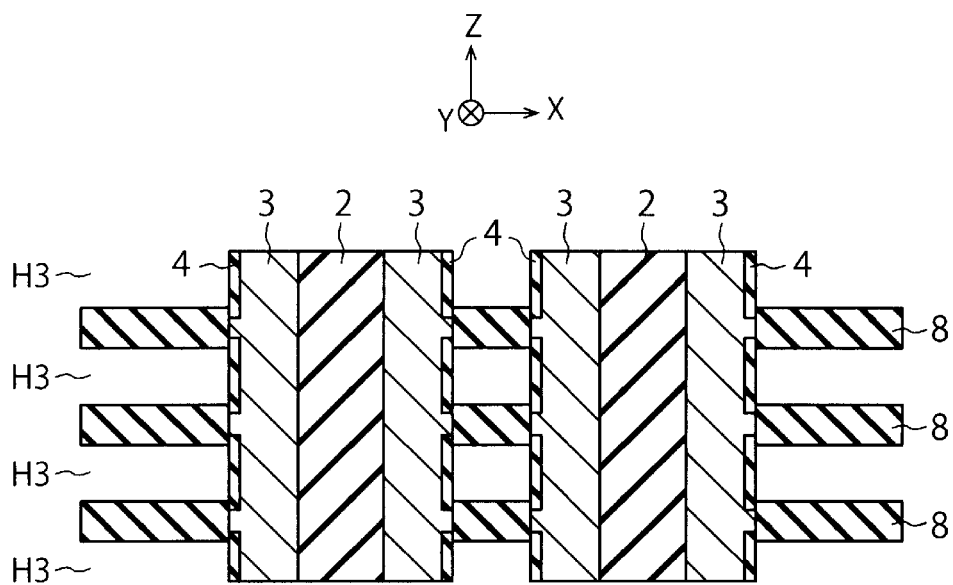

Next, surfaces of the channel semiconductor layer 3 abutting the air gaps H3 are oxidized by thermal oxidation via the air gaps H3 (FIG. 5B). As a result, the tunnel insulating films 4 are formed from portions of the channel semiconductor layer 3 adjacent the air gaps H3. The thermal oxidation in the present embodiment is desirably terminated before the individual tunnel insulating films 4 grow to come in contact with one another. That is, these tunnel insulating films 4 are formed in such a manner as to be divided to correspond to the air gaps H3. Examples of an advantage of forming the tunnel insulating films 4 by oxidizing include an improvement in quality of the tunnel insulating films 4. The tunnel insulating films 4 may be formed in the channel semiconductor layer 3 by performing a treatment on the channel semiconductor layer 3 by another method (for example, oxynitriding).

Figure 6A:
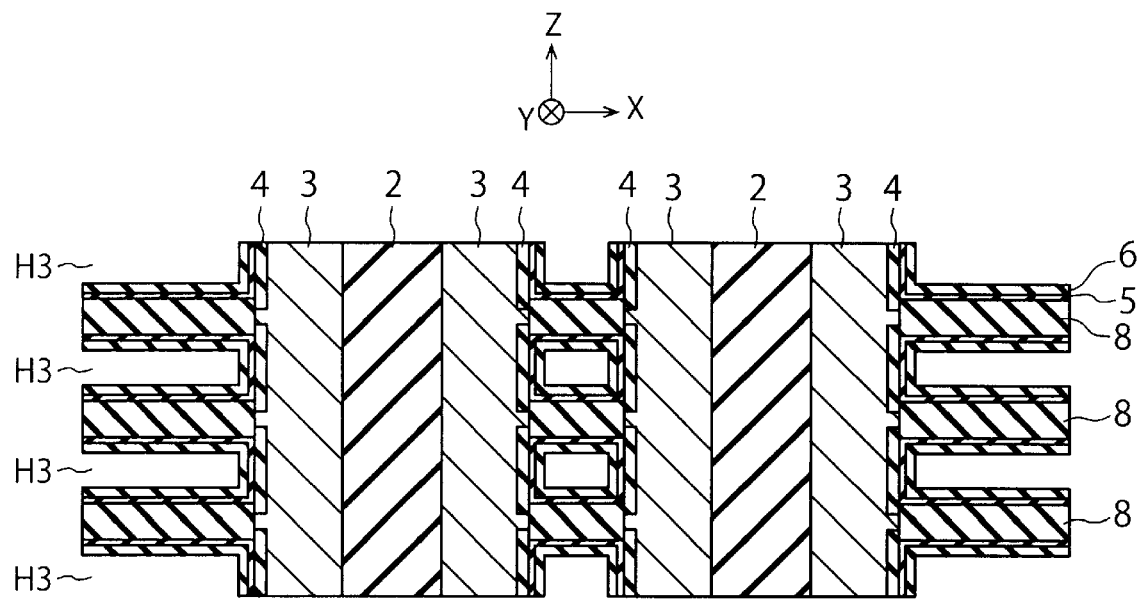

Next, the charge storage layers 5 and the block insulating films 6 are sequentially formed on side surfaces of the tunnel insulating films 4 and upper and lower surfaces of the insulating films 8 in the air gaps H3 (FIG. 6A). It is to be noted that in the present embodiment, tunnel insulating films 4 are not formed inside the regions sandwiched between the Z-direction adjacent insulating layers 8. However, each charge storage layer 5 and each block insulating film 6 include portions formed inside the regions sandwiched between the Z-direction adjacent insulating layers 8. That is, the tunnel insulating films 4 are not between the insulating layers 8, whereas the charge storage layers 5 and the block insulating films 6 include portions between the insulating layers 8.

Figure 6B:
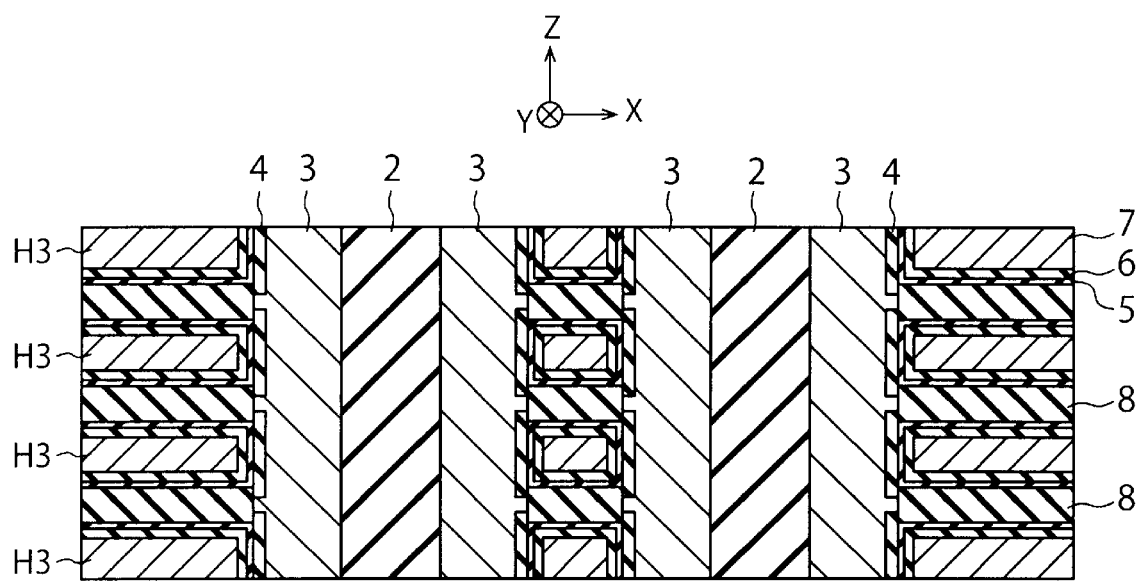

Next, the electrode layers 7 are formed in the air gaps H3 (FIG. 6B). As a result, a stacked film alternately including the electrode layers 7 and the insulating layers 8 is formed on the substrate 1.

Subsequently, various interconnection layers, plug layers, interlayer insulating films, and the like are formed on the substrate 1. In this way, the semiconductor device of FIG. 1 is manufactured.

The channel semiconductor layer 3 will now be described in more detail.

The channel semiconductor layer 3 in the present embodiment is not directly formed on the substrate 1 but rather is formed on the substrate 1 via another layer. For that reason, the channel semiconductor layer 3 is unable to be grown from the substrate 1 itself by epitaxial growth.

Nevertheless, the channel semiconductor layer 3 in the present embodiment is directly formed on the surfaces of the second semiconductor layers 12. Owing to this, the channel semiconductor layer 3 can be grown from the second semiconductor layers 12 by epitaxial growth as a single-crystal semiconductor material The first and second semiconductor layers 11 and 12 in the present embodiment may be semiconductor materials other than the SiGe as long as the first semiconductor layers 11 can be selectively removed in the process of FIG. 3A, the channel semiconductor layers 3 can be grown from the second semiconductor layers 12 by epitaxial growth in the process of FIG. 4B, and the second semiconductor layers 12 can be selectively removed in the process of FIG. 5A. For example, the first semiconductor layers 11 may be SiGe layers and the second semiconductor layers 12 may be Si layers. Similarly, the value of X of the first semiconductor layers 11 may be a value other than 0.50 (50%) and the value of Y of the second semiconductor layers 12 may be a value other than 0.20 (20%).

For example, the value of Y of the second semiconductor layers 12 is desirably equal to or greater than 0.15. This is because when the value of Y is less than 0.15, an etching rate of the second semiconductor layers 12 is low and the second semiconductor layers 12 are difficult to process. On the other hand, a difference between the value of X and the value of Y is desirably equal to or higher than 0.10 (X-Y 0.10). It is thereby possible to set an etching rate of the first semiconductor layers 11 to be, for example, approximately four times as high as the etching rate of the second semiconductor layers 12.

As described above, the channel semiconductor layer 3 in the present embodiment is the single-crystal semiconductor layer having a tubular shape extending in the Z direction. Furthermore, the tunnel insulating films 4 in the present embodiment are divided to correspond to the electrode layers 7. Thus, according to the present embodiment, it is possible to improve the reliability of memory cells and the like. For example, it is possible to increase the cell current of each memory cell and to prevent variations in the cell current and the threshold voltage of the memory cell. Moreover, preventing these variations makes it possible to improve the yield of the semiconductor device.

While it is desirable that the channel semiconductor layer 3 in the present embodiment has a tubular shape extending in the Z direction, the channel semiconductor layer 3 may have a shape other than the tubular shape. For example, the channel semiconductor layer 3 may have a columnar shape extending in the Z direction or a tubular or columnar shape extending in the other direction. In addition, the channel semiconductor layer 3 in the present embodiment may include a single-crystal semiconductor layer with other semiconductor layers (for example, a polycrystalline semiconductor layer).

Furthermore, while each tunnel insulating film 4 is located outside of the region between the insulating layers 8 and each charge storage layer 5 and each block insulating film 6 include portions located inside the region between the insulating layers 8 in the present embodiment, locations of the tunnel insulating films 4, the charge storage layers 5, and the block insulating films 6 are not limited to these locations.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions, and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
   a substrate;
   a plurality of electrode layers and a plurality of insulating layers in an alternating stack above a surface of the substrate;
   a semiconductor column extending in a first direction orthogonal to the surface of the substrate through the plurality of electrode layers and the plurality of insulating layers, the semiconductor column comprising a single-crystal semiconductor material on an outer periphery;
   a plurality of first insulating films between the semiconductor column and the electrode layers, the first insulating films being spaced from each other in the first direction, each first insulating film corresponding to one electrode layer respectively;
   a charge storage layer between each of the first insulating films and each of the electrode layers in a second direction parallel to the surface of the substrate; and
   a second insulating film between the charge storage layer and each of the electrode layers, wherein
   each first insulating film is between the semiconductor column and the charge storage layer in the second direction.

2. The semiconductor device according to claim 1, wherein
   the substrate comprises a semiconductor material at the surface, and
   the single-crystal semiconductor material of the semiconductor column has the same crystal plane orientation as the semiconductor material of the substrate.

3. The semiconductor device according to claim 1, wherein the single-crystal semiconductor material of the semiconductor column comprises silicon and at least one of boron, phosphorus, arsenic, carbon, or germanium.

4. The semiconductor device according to claim 1, wherein the semiconductor column further comprises a third insulating film surrounded by the single crystal semiconductor material in a plane parallel to the surface of the substrate.

5. The semiconductor device according to claim 1, wherein an interior core portion of the semiconductor column is filled with insulating material.

6. The semiconductor device according to claim 1, wherein each first insulating film extends in the first direction beyond a position of an upper surface and a position of a lower surface of the corresponding electrode layer to contact insulating layers adjacent to the corresponding electrode layer in the first direction.

7. The semiconductor device according to claim 1, wherein the charge storage layer and the second insulating film cover upper and lowers surfaces of each electrode layer.

8. The semiconductor device according to claim 1, wherein
   the substrate comprises single crystal silicon,
   the electrode layers are metal,
   the insulating layers are silicon dioxide,
   the single-crystal semiconductor material of the semiconductor column is single crystal silicon,
   the first insulating films are silicon dioxide or silicon oxynitride,
   the charge storage layer is silicon nitride, and
   the second insulating film is silicon dioxide.

9. The semiconductor device according to claim 8, wherein the single-crystal semiconductor material of the semiconductor column has the same crystal plane orientation as the single-crystal silicon of the substrate.

10. The semiconductor device according to claim 1, wherein the semiconductor column is tubular shaped along the first direction and an insulating material fills an interior region of the semiconductor column.

11. The semiconductor device according to claim 1, wherein the electrode layers comprise word lines connected to a plurality of memory cells formed along a length of the semiconductor column in the first direction.

12. The semiconductor device according to claim 1, wherein the charge storage layer directly contacts the second insulating film.

13. The semiconductor device according to claim 1, wherein each first insulating film is not between insulating layers in the alternating stack in the first direction.

14. A semiconductor memory device, comprising:
    a substrate having a first semiconductor material at a surface thereof;
    an alternating stack of electrode layers and insulating layers above the surface of the substrate;
    a memory column extending in a first direction orthogonal to the surface of the substrate through the electrode layers and the insulating layers, the memory column comprising a single-crystal semiconductor material on an outer periphery facing the electrode layers and the insulating layers;
    a plurality of tunnel insulating films between the memory column and the electrode layers, the tunnel insulating films being spaced from each other in the first direction, each tunnel insulating film being in a position corresponding to one of the electrode layers;
    a charge storage layer between each of the tunnel insulating films and each of the electrode layers in a second direction parallel to the surface of the substrate; and
    a block insulating film between the charge storage layer and each of the electrode layers, wherein
    each tunnel insulating film is between the memory column and the charge storage layer in the second direction.

15. The semiconductor device according to claim 14, wherein
    the single-crystal semiconductor material of the memory column has the same crystal plane orientation as the semiconductor material of the substrate.

16. The semiconductor memory device according to claim 15, wherein the single-crystal semiconductor material of the memory column comprises silicon and at least one of boron, phosphorus, arsenic, carbon, or germanium.

17. The semiconductor memory device according to claim 14, wherein an interior core portion of the memory column is filled with insulating material.

18. The semiconductor device according to claim 14, wherein the charge storage layer and the block insulating film are between each electrode layer and insulating layer adjacent in first direction.

19. The semiconductor device according to claim 14, wherein the charge storage layer directly contacts the block insulating film.

20. The semiconductor device according to claim 14, wherein each tunnel insulating film is not between insulating layers of the alternating stack in the first direction.

* * * * *